_(12)_ United States Patent
Schwarz et al.

(10) Patent No.: US 6,255,836 B1
(45) Date of Patent: Jul. 3, 2001

(54) BUILT-IN SELF-TEST UNIT HAVING A RECONFIGURABLE DATA RETENTION TEST

(75) Inventors: William Schwarz, San Jose; V. Swamy Irrinki, Milpitas, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/481,891

(22) Filed: Jan. 12, 2000

(51) Int. Cl.$^7$ .................................................. G01R 31/02
(52) U.S. Cl. ............................................. 324/763; 324/765
(58) Field of Search ..................................... 324/763, 765, 324/769; 365/200, 201; 714/718, 733

(56) References Cited

U.S. PATENT DOCUMENTS

| | | | |
|---|---|---|---|
| 5,173,906 | * 12/1992 | Dreilbelis | 371/22.5 |
| 5,675,545 | * 10/1997 | Madhavan et al. | 365/201 |
| 5,875,153 | * 2/1999 | Hii et al. | 365/233 |
| 5,920,515 | * 7/1999 | Shaik et al. | 365/200 |
| 5,991,213 | * 11/1999 | Cline et al. | 365/201 |
| 6,014,336 | * 1/2000 | Powell et al. | 365/201 |

* cited by examiner

*Primary Examiner*—Safet Metjahic
*Assistant Examiner*—T. R. Sundaram

(57) ABSTRACT

An integrated circuit device is disclosed having a BIST Uinit with recolfiLgurable data retention testing for a memory array. In one embodiment, the integrated circuit device includes a memory array, a BIST unit, an externally-programmable pause count register, and a pause counter. The BIST unit is configured to apply a test pattern of memory accesses to the memory array. The test pattern preferably includes a first phase for writing data values to the memory array, a second phase for stressing the memory array, and a third phase for verifying the data values after the array has been stressed. The length of the second phase is determined by the count stored in the externally-programmable register. The count may be loaded into the pause counter by the BIST prior to the second phase. In the second phase, the BIST unit asserts a pause signal which causes the pause counter to suppress the clock signal to the BIST unit during the second phase, thereby suspending the BIST unit's activity. The pause signal may also initiate "disturbances" to the memory array during the second phase, such as degrading the power supply voltage and initiating the activity of a sub-BIST unit that conducts memory accesses near a target memory location designed to "stress" that target memory location. Once the pause counter finishes counting, the clock signal to the BIST unit is re-established, allowing the BIST unit to conduct the verification phase.

7 Claims, 1 Drawing Sheet

BUILT-IN SELF-TEST UNIT HAVING A RECONFIGURABLE DATA RETENTION TEST

BACKGROUND OF THE INVENTION

1. Field of the Invention

This invention relates generally to the field of built-in self-test (BIST) units for memories in integrated circuits. More particularly, this invention relates to BIST units configured to perform data retention testing in a configurable manner.

2. Description of the Related Art

Since users generally depend upon the reliability of memory chips and other integrated circuits for their own systems to function properly, it is common practice for the chip manufacturers to test the functionality of chips at the manufacturing site before the chips are sold to users. The manufacturers' reputations depend upon the reliability of their chips. As the line width within an integrated circuit chip continues to shrink, this reliability becomes more difficult to achieve. An ongoing challenge for the chip manufacturers is to increase the number and density of transistors on a chip without sacrificing reliability or suffering decreasing chip yields due to malfunctioning parts.

Before the chips are released for shipment, they typically undergo testing to verify that the circuitry for each of the major on-chip modules is functioning properly. One standard way for testing chips involves using an external memory tester or Automatic Test Equipment (ATE) at the manufacturing site. An external memory tester supplies power and applies test patterns to the chip to detect faults. External testers can only test a limited number of chips at a time, and the test speed is limited by the external bus speed. Consequently, this method of testing is expensive in terms of time requirements and equipment costs.

Partly to address these issues, and partly to provide off-site testing, built-in self-test (BIST) units are now commonly incorporated into memory chips and other integrated circuits. Automated test equipment can now be simplified to the extent that the only necessary functions are to supply power (and sometimes a clock signal) to the chip, and to monitor a single output signal from the chip. The on-board BIST unit generates all the test patterns and asserts (or de-asserts) the output signal if the chip passes the functionality test. The BIST can be configured to run every time the chip is powered-on, or the BIST may be configured to run only when a test mode signal is asserted.

A memory BIST unit operates by writing and reading various patterns to/from the memory to determine various kinds of memory faults. In general, a memory BIST unit writes a data value to a memory cell and subsequently reads the memory cell. By comparing the data written and the data subsequently returned from the memory cell, the memory BIST unit is able to determine whether the memory cell is faulty. If too many errors are detected, then the fault may exist in the support circuitry for the memory cell array.

One memory test not conducted by BIST units is an extended data retention test. In this test, an initial data pattern is written to the memory array and then verified after a measured time delay. In some variations, "disturbances" are made during the delay, such as intentionally degrading the power supply voltage. These extended data retention tests are conducted using external testers. In memories with BIST units, the external testers perform this test by controlling the clock signal to the memory chip. Enough clock cycles are provided to allow the BIST unit to write the initial data pattern, and then the clock is halted during the delay. After the delay the clock is restarted so that the BIST unit can complete its normal test sequence, thereby revealing any errors which have occurred during the delay.

Although effective, this method has two primary disadvantages. First, since it requires an external tester and detailed knowledge of the BIST algorithm, it can only be conducted by the manufacturer. Consequently, extended data retention testing is not possible in the field. Second, it can be difficult to program an external tester to place pauses at the correct points in the BIST algorithm. This is particularly true for a complex, multi-million cycle BIST routine which requires pauses in different locations. This difficulty is further compounded by the fact that when changes are made to either the BIST unit or the memory array, the pause locations must be recalculated.

SUMMARY OF THE INVENTION

Accordingly, there is disclosed herein an integrated circuit device having a BIST unit with reconfigurable data retention testing for a memory array. In one embodiment, the integrated circuit device includes a memory array, a BIST unit, an externally-programmable pause count register, and a pause counter. The BIST unit is configured to apply a test pattern of memory accesses to the memory array. The test pattern preferably includes a first phase for writing data values to the memory array, a second phase for stressing the memory array, and a third phase for verifying the data values after the array has been stressed. The length of the second phase is determined by the count stored in the eternally-programmable register. The Count may be loaded into the pause counter by the BIST prior to the second phase. In the second phase, the BIST unit asserts a pause signal which causes the pause counter to suppress the clock signal to the BIST unit during the second phase, thereby suspending the BIST unit's activity. The pause signal may also initiate "disturbances" to the memory array during the second phase, such as degrading the power supply voltage and initiating the activity of a sub-BIST unit that conducts memory accesses near a target memory location designed to "stress" that target memory location. Once the pause counter finishes counting, the clock signal to the BIST unit is reestablished, allowing the BIST unit to conduct the verification phase.

BRIEF DESCRIPTION OF THE DRAWINGS

Other objects and advantages of the invention will become apparent upon reading the following detailed description and upon reference to the accompanying drawings in which.

Figure 1:
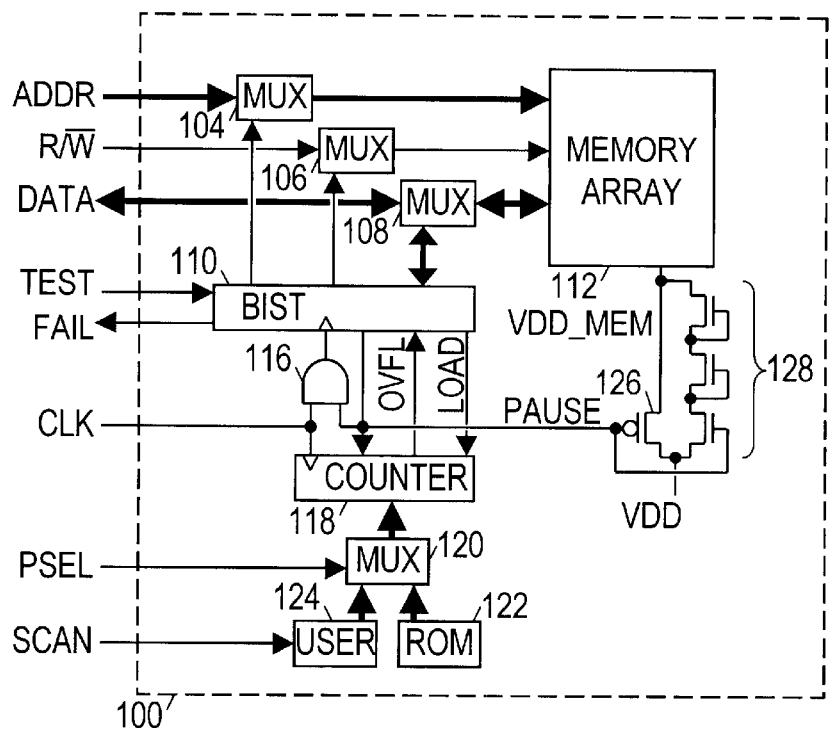
FIG. 1 is a functional block diagram of a memory equipped with an augmented BIST unit according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "deassert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high. As used herein, the term "BIST" refers to the actual test, while "BIST unit" and "BIST circuitry" refer to the circuitry that performs BIST. Similarly, "BISR" refers to the process of built-in self repair, while "BISR unit" and "BISR circuitry" refer to the circuitry that performs BISR.

DETAILED DESCRIPTION OF THE INVENTION

Turning now to the figures, FIG. 1 shows a memory 100 having a set of signal lines that include an address bus (ADDR), a read/write line (R/$\overline{\text{W}}$), a bidirectional data bus (DATA), a test line (TEST), a fail line (FAIL), a clock line (CLK), a pause select line (PSEL), and a scan input line (SCAN). A set of multiplexers 104, 106, and 108 allows a BIST unit 110 to take control of the ADDR, R$\overline{\text{W}}$, and DATA lines, respectively, when the TEST line is asserted. The ADDR, R/$\overline{\text{W}}$ and DATA lines from multiplexers 102, 106, 108 connect to memory array 112.

The memory array 112 includes an array of memory cells along with support circuitry such as an address decoder, write drivers, and sense amplifiers (not specifically shown). Address information provided to the memory array 112 on the ADDR bus causes the address decoder to access one or more corresponding memory locations. If the read/write line is asserted, data stored in the accessed memory locations is driven onto the DATA bus. Otherwise data provided on the DATA bus is stored into the accessed memory locations.

When the TEST line is asserted, the BIST unit 110 takes control of the ADDR, R/$\overline{\text{W}}$, and DATA lines, and conducts a pattern of read and write operations designed to detect faults in the memory array 112. During write operations, the BIST unit 110 supplies test data to the memory array on the DATA lines. During read operations, the BIST unit 110 compares values on the DATA lines to the expected output. When a mismatch is detected, BIST unit 110 asserts the FAIL signal line. In alternative embodiments, BIST unit 110 may instead notify a built-in self-repair (BISR) unit of the error, and the BISR unit may replace the faulty memory location with a redundant memory location.

The BIST unit 110 operates in response to a BIST clock signal received from logical AND gate 116. Gate 116 blocks or passes the CLK signal in response to assertion or deassertion of a PAUSE signal, respectively The BIST unit 110 asserts the PAUSE signal at the desired points in the BIST algorithm where an extended data retention test is desired.

The length of the pause is controlled by a counter 18. Prior to assertion of the PAUSE signal, the counter receives an asserted LOAD signal from BIST unit 110. This causes the counter to load an initial count value. The initial count value may be selected by a multiplexer 120 from a read-only register (ROM) 122 or from a user programmable register 124 in response to a pause select (PSEL) signal. The PSEL signal and the user-programmable register 124 is externally accessible, and may be set by scanning in a value serially on the SCAN signal line. For normal production and field testing, the ROM register would typically be used. This holds because by the time a device is ready to go into production, the pause time and clock rate will be known and the appropriate count can be programmed into the ROM register. For example, a dynamic memory array with an 8 ms refresh time and 1 MHz clock rate would have the ROM register programmed with an 8000 count for all parts.

In many cases, such as with new technologies or prototype devices, a definite pause time may not be known. The user-programmable register can be used to characterize the pause time specifications on prototypes or test chips. Once an appropriate pause time has been determined, it can be programmed into the ROM register of production devices without modification to the design. The user-programmable register may also serve to aid in debugging failing parts in the field or in the factory.

For some test algorithms, multiple pauses of different lengths may be desired. In this situation, multiple user-programmable and ROM registers may be provided to allow the different pause periods.

After the counter 118 is loaded, assertion of the PAUSE signal causes the counter to count down to zero from the initial value, decrementing once per clock cycle. When the counter reaches zero, an additional decrement causes the overflow signal to be asserted, which in turn causes the BIST unit 110 to de-assert the PAUSE signal. De-assertion of the PAUSE signal allows the clock signal to pass through gate 116 so that the BIST unit 110 can proceed with the next portion of the algorithm.

In certain devices it may be desired to "stress" the memory array during the pause to better identify faulty memory cells. For static memory (SRAM) devices, this may be implemented by intentional degradation of the power supply voltage. In the embodiment of FIG. 1, assertion of the PAUSE signal deactivates bypass transistor 126 and forces the power supply current to the memory array 112 to flow through transistor chain 128, thereby introducing several transistor $V_T$, drops in the supply voltage to the memory array.

Preferably at the start of each BIST execution, the BIST unit 110 asserts the LOAD signal which causes the counter 118 to load the pause count. When the BIST determines a pause should be inserted, it asserts the PAUSE signal. Assertion of the PAUSE signal (1) enables the counter to start counting down from the initial value, (2) blocks the clock signal to the BIST unit thereby preventing the BIST unit from advancing, and (3) optionally lowers the power supply voltage to the memory array. When the counter 118 counts down past zero, the OVFL signal is asserted to the BIST unit which then deasserts the PAUSE signal. This causes the BIST unit's testing of the memory array to resume. If multiple pauses are required, the BIST unit 110 re-asserts the LOAD signal upon receipt of the OVFL signal assertion. Where different pause times are needed, multiple registers will be provided, and the LOAD signal will be a multi-bit signal which also indicates which register to load from.

Figure 2:
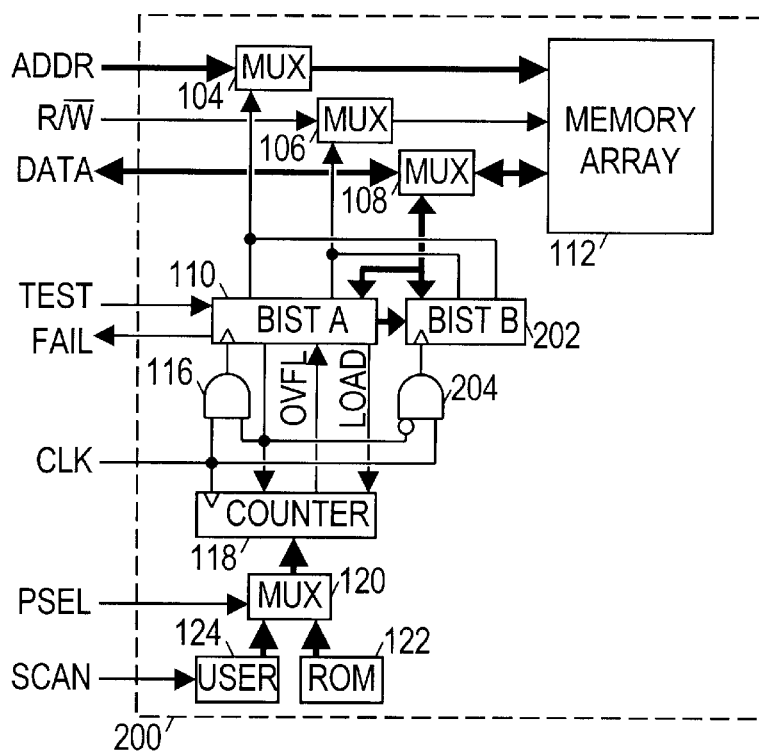
FIG. 2 is a functional block diagram of a second embodiment of a memory with an augmented BIST unit.

FIG. 2 shows an alternative configuration in which control is passed from a primary BIST unit 110 to a secondary BIST unit 202 during the "pause" periods. Assertion of the PAUSE signal causes gate 116 to block the clock signal to BIST unit 110, and further causes gate 204 to pass the clock signal to BIST unit 202. While asserting the PAUSE signal, the primary BIST unit may also provide an address value to secondary BIST unit 202. The secondary BIST unit then proceeds to "stress" the memory array by writing conflicting data patterns to the addresses around the selected address value in an attempt to disturb the data stored at the selected address.

Numerous variations and modifications will become apparent to those skilled in the art once the above disclosure is fully appreciated. It is intended that the following claims be interpreted to embrace all such variations and modifications.

What is claimed is:

1. An integrated circuit device comprising:

a memory array;

a built-in self-test (BIST) unit coupled to the memory array and configured to apply a test pattern of memory accesses to the memory array;

a register configured to hold a pause count;

a pause counter configurable to receive the pause count from the register and configured to measure a pause interval corresponding to the pause count when the BIST unit asserts a pause signal; and a clock gate configured to block a clock signal to the BIST unit during assertion of the pause signal.

2. An integrated circuit device comprising:

a memory array;

a built-in self-test (BIST) unit coupled to the memory array and configured to apply a test pattern of memory accesses to the memory array;

a register configured to hold a pause count;

a pause counter configurable to receive the pause count from the register and configured to measure a pause interval corresponding to the pause count when the BIST unit asserts a pause signal;

a sub-BIST unit configured to receive an address from the BIST unit and configured to perform repeated accesses to one or more memory locations adjacent to said address when the BIST unit asserts the pause signal;

a BIST clock gate configured to block a clock signal to the BIST unit during assertion of the pause signal; and a sub-BIST clock gate configured to pass the clock signal to the sub-BIST unit during assertion of the pause signal.

3. An integrated circuit device comprising:

a memory array;

a built-in self-test (BIST) unit coupled to the memory array and configured to apply a test pattern of memory accesses to the memory array;

a register configured to hold a pause count;

a pause counter configurable to receive the pause count from the register and configured to measure a pause interval corresponding to the pause count when the BIST unit asserts a pause signal;

a transistor chain coupled between a power supply terminal of the memory array and a voltage source and configured to degrade the voltage received by the memory array; and a bypass transistor coupled between both ends of the transistor chain and configured to conduct only when the pause signal is de-asserted.

4. The integrated circuit device of claim 1, wherein said register is an externally programmable register, and wherein the integrated circuit device further comprises:

a read-only register configured to hold a predetermined pause count;

a multiplexer coupled to the pause counter to provide a pause count selected from the read-only register and the externally-programmable register by an externally-accessible selection signal.

5. An integrated circuit device comprising:

a memory array configured to store data in a plurality of memory locations;

a built-in self-test (BIST) unit coupled to the memory array to apply a pattern of memory accesses to test data retention capability of the memory locations, wherein the pattern includes a first phase for writing data to the memory locations, a second phase for stressing the memory locations, and a third phase for verifying the contents of the memory locations;

a pause counter configured to suppress a number of clock cycles to the BIST unit during the second phase, wherein the number is determined by a pause count register;

a sub-BIST unit configured to receive a test address from the BIST unit and configured to perform during the second phase repeated accesses to one or more addresses near the test address;

a BIST clock gate configured to block a clock signal to the BIST unit while the pause counter is counting; and a sub-BIST clock gate configured to pass the clock signal to the sub-BIST unit while the pause counter is counting.

6. An integrated circuit device comprising:

a memory array configured to store data in a plurality of memory locations;

a built-in self-test (BIST) unit coupled to the memory array to apply a pattern of memory accesses to test data retention capability of the memory locations, wherein the pattern includes a first phase for writing data to the memory locations, a second phase for stressing the memory locations, and a third phase for verifying the contents of the memory locations;

a pause counter configured to suppress a number of clock cycles to the BIST unit during the second phase, wherein the number is determined by a pause count register; a sub-BIST unit configured to receive a test address from the BIST unit and configured to perform during the second phase repeated accesses to one or more addresses near the test address;

a transistor chain coupled between a power supply node of the memory array and a voltage source, and configured to degrade the voltage received by the memory array; and a bypass transistor coupled between both ends of the transistor chain and configured to bypass the transistor chain when the pause counter is not counting.

7. The integrated circuit device of claim 6, wherein the pause count register is externally-programmable, and wherein the device further comprises:

a read-only register configured to hold a predetermined pause count; and a multiplexer coupled to the pause counter to provide a pause count selected from the read-only register and the externally-programmable register by an externally-accessible selection signal.

* * * * *